United States Patent
Lee et al.

(10) Patent No.: US 9,368,168 B2
(45) Date of Patent: *Jun. 14, 2016

(54) NONVOLATILE MEMORY DEVICE INCLUDING A PERIPHERAL CIRCUIT TO RECEIVE AN ADDRESS IN SYNCH WITH ONE OF A RISING AND FALLING EDGE OF A SIGNAL REGARDLESS OF WHETHER A FIRST OR SECOND ALIGNMENT TYPE IS SELECTED AND NONVOLATILE MEMORY SYSTEM INCLUDING THE SAME

(71) Applicant: SAMSUNG ELECTRONICS CO., LTD., Suwon-si, Gyeonggi-do (KR)

(72) Inventors: Kyeong-Han Lee, Gyeonggi-do (KR); Seok-Cheon Kwon, Gyeonggi-do (KR); Dong-Yang Lee, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/856,218

(22) Filed: Sep. 16, 2015

(65) Prior Publication Data

US 2016/0005483 A1    Jan. 7, 2016

Related U.S. Application Data

(63) Continuation of application No. 12/393,397, filed on Feb. 26, 2009, now abandoned.

(30) Foreign Application Priority Data

Feb. 27, 2008  (KR) .................. 10-2008-0017956
Jun. 27, 2008  (KR) .................. 10-2008-0061767

(51) Int. Cl.
   *G11C 7/10*      (2006.01)
   *G11C 16/32*     (2006.01)
   (Continued)

(52) U.S. Cl.
   CPC ......... *G11C 7/10* (2013.01); *G11C 7/106* (2013.01); *G11C 7/1051* (2013.01);
   (Continued)

(58) Field of Classification Search
   CPC ...... G11C 7/10; G11C 7/1018; G11C 7/1051; G11C 7/106; G11C 7/1066; G11C 7/22; G11C 7/222; G11C 16/102; G11C 16/08; G11C 16/26; G11C 2207/107; G11C 2207/2281
   See application file for complete search history.

(56) References Cited

U.S. PATENT DOCUMENTS 6,324,118 B1   11/2001   Ooishi
6,570,791 B2   5/2003    Roohparvar et al.
(Continued)

FOREIGN PATENT DOCUMENTS

JP    2000-182399    6/2000
JP    2005-115562    4/2005
(Continued)

OTHER PUBLICATIONS

Patent Board Decision dated Jul. 20, 2015 in parent U.S. Appl. No. 12/393,397.

*Primary Examiner* — Vanthu Nguyen
(74) *Attorney, Agent, or Firm* — F. Chau & Associates, LLC

(57) ABSTRACT

A flash memory device including: a memory cell array; a signal generator inputting a first data fetch signal and outputting a second data fetch signal; and an output buffer circuit configured to output data from the memory cell array in sync with rising and falling edges of the second data fetch signal, wherein second data fetch signal is output along with data output from the output buffer circuit.

20 Claims, 18 Drawing Sheets

(51) Int. Cl.
  *G11C 7/22* (2006.01)
  *G11C 16/10* (2006.01)
  *G11C 16/08* (2006.01)
  *G11C 16/26* (2006.01)

(52) U.S. Cl.
  CPC ............... *G11C 7/1066* (2013.01); *G11C 7/22* (2013.01); *G11C 7/222* (2013.01); *G11C 16/32* (2013.01); *G11C 7/1018* (2013.01); *G11C 16/08* (2013.01); *G11C 16/102* (2013.01); *G11C 16/26* (2013.01); *G11C 2207/107* (2013.01); *G11C 2207/2281* (2013.01)

(56) References Cited

U.S. PATENT DOCUMENTS

| | | | |
|---|---|---|---|
| 6,707,723 B2 | 3/2004 | Jeong | |
| 6,754,133 B2 | 6/2004 | Morita et al. | |
| 6,789,209 B1* | 9/2004 | Suzuki | G11C 7/1051 713/401 |
| 7,020,031 B2 | 3/2006 | Shin et al. | |
| 7,158,440 B2 | 1/2007 | Duh et al. | |
| 7,280,426 B2 | 10/2007 | Miura et al. | |
| 7,345,926 B2 | 3/2008 | Kagan et al. | |
| 7,362,648 B2 | 4/2008 | Park et al. | |
| 7,606,992 B1 | 10/2009 | Karabatsos | |
| 7,671,853 B2 | 3/2010 | Morita | |
| 7,688,652 B2 | 3/2010 | Oh | |
| 7,697,369 B2 | 4/2010 | Koshizuka | |
| 8,286,021 B2 | 10/2012 | Kim et al. | |
| 2001/0015927 A1 | 8/2001 | Ooishi | |
| 2003/0043624 A1 | 3/2003 | Roohparvar et al. | |
| 2005/0135145 A1 | 6/2005 | Lee et al. | |
| 2006/0023499 A1* | 2/2006 | Ryu | G11C 7/1051 365/185.01 |
| 2006/0083081 A1 | 4/2006 | Park et al. | |
| 2006/0250884 A1 | 11/2006 | Shimbayashi | |
| 2007/0247933 A1 | 10/2007 | Kagan | |
| 2008/0101138 A1 | 5/2008 | Jo | |
| 2008/0141059 A1 | 6/2008 | Kim et al. | |
| 2009/0190431 A1* | 7/2009 | Gronlund | G11C 7/103 365/233.11 |

FOREIGN PATENT DOCUMENTS

| | | |
|---|---|---|
| JP | 2005-182996 | 7/2005 |
| KR | 20000005666 | 1/2000 |
| KR | 1020050062744 A | 6/2005 |
| KR | 100791839 | 1/2008 |

* cited by examiner

|  | Command latch cycle | Address latch cycle | Input data latch cycle | data output cycle |
|---|---|---|---|---|
| ALE | 0 | 1 | 0 | 1 |
| CLE | 1 | 0 | 0 | 1 |

(tWLTD : Not Fixed)

NONVOLATILE MEMORY DEVICE INCLUDING A PERIPHERAL CIRCUIT TO RECEIVE AN ADDRESS IN SYNCH WITH ONE OF A RISING AND FALLING EDGE OF A SIGNAL REGARDLESS OF WHETHER A FIRST OR SECOND ALIGNMENT TYPE IS SELECTED AND NONVOLATILE MEMORY SYSTEM INCLUDING THE SAME

CROSS-REFERENCE TO RELATED APPLICATIONS

This application is a continuation of U.S. application Ser. No. 12/393,397 filed on Feb. 26, 2009, which claims priority under 35 U.S.C. §119 to Korean Patent Applications No. 10-2008-0017956 filed on Feb. 27, 2008, and No. 10-2008-0061767 filed on Jun. 27, 2008, the disclosures of which are incorporated by reference herein in their entirety.

BACKGROUND

The present disclosure relates to semiconductor memory devices and, more particularly, to flash memory devices.

Flash memory devices that are used as nonvolatile memories are electrically erasable and programmable read-only memories (EEPROMs) in which plural memory blocks are erased or written with data by a one-time programming operation. A general EEPROM has the feature that a memory block is just erasable or programmable in a fixed time. This means that the flash memories operate more rapidly and effectively in reading and writing data when systems employing them read and write data from and into other memory areas at the same time. Flash memories or EEPROMs are usually structurally configured such that insulation films enclosing charge storage elements used for storing data are inevitably worn out after the specific number of operations.

Flash memories store information on their silicon chips even without a power supply being activated. In other words, flash memories are able to retain their information without power consumption even in the face of a power interruption to the chips thereof. Additionally, flash memories offer resistance to physical impulses and a fast access times for reading. With those features, flash memories are generally used as storage units in electronic apparatuses powered up by batteries.

SUMMARY OF THE INVENTION

Exemplary embodiments of the present invention are directed to a flash memory device with a reduced number of pins, and a flash memory system including the same.

Exemplary embodiments of the present invention are directed to a flash memory device suitable for fast data transmission, and a flash memory system including the same.

An exemplary embodiment of the present invention provides a flash memory device including: a memory cell array; a signal generator inputting a first data fetch signal and outputting a second data fetch signal; and an output buffer circuit configured to output data from the memory cell array in sync with rising and falling edges of the second data fetch signal. The second data fetch signal is output along with data output from the output buffer circuit.

In an exemplary embodiment, the signal generator delays the first data fetch signal and outputs the delayed signal as the second data fetch signal.

In an exemplary embodiment, the flash memory device further includes an input buffer circuit configured to input data in sync with the first data fetch circuit.

According to an exemplary embodiment, the flash memory device further includes: a control logic circuit; and a reading/programming circuit controlled by the control logic circuit, reading data from the memory cell array in a reading operation and programming data into the memory cell array in a programming operation.

In an exemplary embodiment, the control logic circuit activates the signal generator to output the second data fetch signal in a data output cycle.

According to an exemplary embodiment, the flash memory device further includes: a control logic circuit configured to discriminate a data input/output cycle into an address latch cycle, a command latch cycle, an input data latch cycle, or a data output cycle with reference to a combination of an address latch enabling signal and a command latch enabling signal.

In an exemplary embodiment, the first data fetch signal is toggled in the address latch cycle, the command latch cycle, the input data latch cycle, and the data output cycle.

In an exemplary embodiment, the control logic circuit determines the data input/output cycle as a serial access cycle if the address and command latch enabling signals are all set on high level.

An exemplary embodiment of the present invention provides a flash memory device including: a memory cell array; a control logic circuit configured to discriminate a data input/output cycle into an address latch cycle, a command latch cycle, an input data latch cycle, or a data output cycle with reference to a combination of an address latch enabling signal and a command latch enabling signal; a reading/programming circuit controlled by the control logic circuit, reading data from the memory cell array in a reading operation and programming data into the memory cell array in a programming operation; a signal generator delaying a first data fetch signal and outputting a second data fetch signal if the data input/output cycle is determined as the data output cycle; and an output buffer circuit sequentially outputting data of the reading/programming circuit in sync with rising and falling edges of the second data fetch signal if the data input/output cycle is determined as the data output cycle. The second data fetch signal is output to an external device along with data output from the output buffer circuit.

In an exemplary embodiment, the flash memory device further includes an input buffer circuit operating in sync with the first data fetch signal and interfacing data to be stored in the memory cell array.

According to an exemplary embodiment, the output buffer circuit is configured to interface data in sync with the second data fetch signal by an edge alignment mode and a double data rate mode.

An exemplary embodiment of the present invention provides a flash memory system including: a flash memory device; and a memory controller configured to control the flash memory device. The flash memory device generates a second data fetch signal from a first data fetch signal provided from the memory controller in a reading operation and outputs read data to the memory controller in sync with the second data fetch signal, wherein the second data fetch is transferred to the memory controller along with the read data.

In an exemplary embodiment, the flash memory device outputs data to the memory controller in sync with the second data fetch signal by an edge alignment mode and a double data rate mode.

In an exemplary embodiment, the flash memory system includes one of an SSD, a memory module, and a memory card.

According to an exemplary embodiment, the flash memory device is configured to discriminate a data input/output cycle into an address latch cycle, a command latch cycle, an input data latch cycle, or a data output cycle with reference to a combination of an address latch enabling signal and a command latch enabling signal that are provided from the memory controller.

In an exemplary embodiment, the first data fetch signal is toggled in the address latch cycle, the command latch cycle, the input data latch cycle, and the data output cycle.

According to an exemplary embodiment, the flash memory device determines the data input/output cycle as a data output cycle if the address and command latch enabling signals are all set on high level.

In an exemplary embodiment, the data output cycles includes a serial access cycle of a reading operation, a data output cycle of an identification reading operation, and a data output cycle of a state reading operation.

According to exemplary embodiments of the present invention, it is possible to transfer data at a high frequency, while reducing the number of pins as well.

A further understanding of the nature and advantages of exemplary embodiments of the present invention herein may be realized by reference to the remaining portions of the specification and the attached figures.

BRIEF DESCRIPTION OF THE FIGURES

Exemplary embodiments of the present invention will be understood in more detail from the following descriptions taken in conjunction with the following figures, wherein like reference numerals refer to like parts throughout the various figures unless otherwise specified. In the figures.

DETAILED DESCRIPTION OF EXEMPLARY EMBODIMENTS

Figures 1, 2:
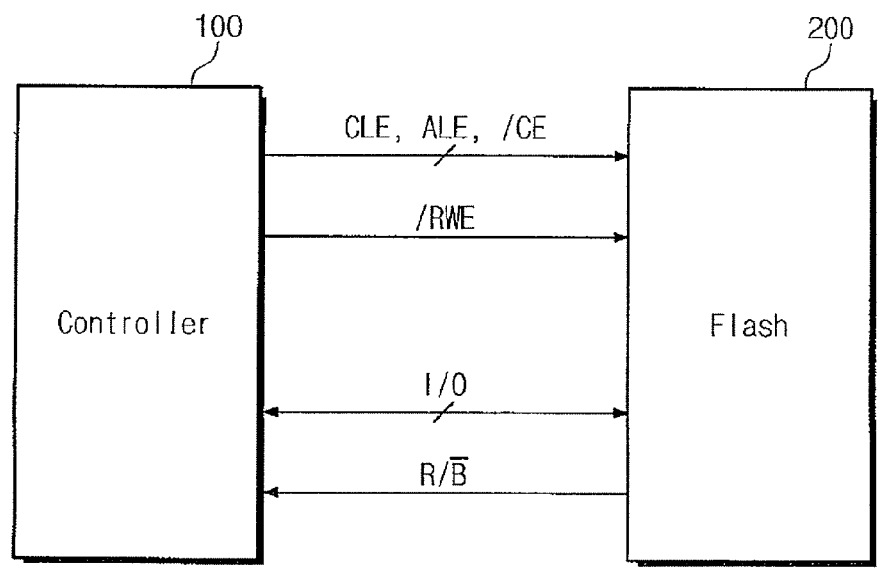
FIG. 1 is a schematic block diagram of a flash memory system according to an exemplary embodiment of the present invention.
FIG. 2 shows a table summarizing modes used to discriminate data types input through input/output pins in the flash memory system according to an exemplary embodiment of the present invention.

Exemplary embodiments of the present invention will be described below, involving a flash memory device as an example in illustrating structural and operational features of the present invention.

The present invention may, however, be embodied in different forms and should not be construed as limited to the exemplary embodiments set forth herein. Rather, these exemplary embodiments are provided so that this disclosure will be thorough and complete, and will fully convey the scope of the present invention to those skilled in the art. Like reference numerals refer to like elements throughout the accompanying figures.

Hereinafter, an exemplary embodiment of the present invention will be described in conjunction with the accompanying drawings.

FIG. 1 is a schematic block diagram of a flash memory system according to an exemplary embodiment of the present invention.

Referring to FIG. 1, the flash memory device according to an exemplary embodiment of the present invention is equipped with a plurality of control pins, for example, ALE, CLE, /CE, /RWE, R/BB, and the like and input/output pins I/O0-I/O7. In this exemplary embodiment, ALE denotes an address latch-enable signal, CLE denotes a command latch-enable signal, and /CE denotes a chip selection signal. Although not shown in the FIG. 1, it should be understood by those of ordinary skill in the art that the flash memory device is further comprised of power pins, and so forth. The /RWE pin is provided for receiving a signal transferred from a memory controller 100 to a flash memory device 200. The flash memory device 200 fetches data, an address, or a command transferred from the memory controller 100 by means of a signal, hereinafter referred to as 'data fetch signal', input through the /RWE pin. Additionally, the flash memory device 200 outputs data toward the memory controller 100 in response to the data fetch signal input through the .RWE pin. In an exemplary embodiment, the flash memory device 200 outputs data in sync with a low-to-high or high-to-low transition of the data fetch signal input through the /RWE pin. Otherwise, the flash memory device 200 outputs data in sync respectively with low-to-high and high-to-low transitions of the data fetch signal input through the /RWE pin. In summary, the flash memory device 200 is able to output data in a single data rate (SDR) or double data rate (DDR) mode. Also, the flash memory device 200 accepts an address or command in sync with low-to-high and/or high-to-low transition(s) of the data fetch signal input through the /RWE pin.

As well known by those of ordinary skill in the art, a generic flash memory device may include /RW and /WE pins (not shown in FIG. 1). The memory controller 100 outputs a clock signal to the /RE pin (not shown) in order to fetch data (including data that has been read) from the flash memory device. The memory controller 100 outputs a clock signal to the /WE pin (not shown) in order to transfer data including addresses, commands, and program data to the flash memory device. A generic flash memory device uses a dual clocking scheme accompanying the /RE and /WE pins in order to transfer information such as data, addresses, and commands. On the other hand, the flash memory system of an exemplary embodiment of the present invention employs a unified data fetch scheme by only using just the /RWE pin. By using the unified data fetch scheme, it is possible to reduce the number of pins in the flash memory device 200 and the memory controller 100. As the flash memory device 200 is configured in the command/address/data multiplexed I/O architecture and the unified clocking scheme is applied to the flash memory system, there is a need for discriminating whether data input/output through the input/output pins are read data, addresses, program data, or commands. This discrimination can be accomplished in various ways, which will be detailed hereinbelow.

FIG. 2 shows a table summarizing modes used to discriminate data types input through the input/output pins in the flash memory system according to an exemplary embodiment of the present invention.

Referring to FIG. 2, the flash memory system according to an exemplary embodiment of the present invention operates to discriminate a data type by way of a logical combination with the control signals ALE and CLE input respectively through the ALE and CLE pins. For instance, when the control signals ALE and CLE are conditioned in low and high levels respectively, data input through the input/output pins are regarded as a command. That is, the flash memory device 200 determines a data input/output cycle as a command latch cycle in response to a logical combination with the control signals ALE and CLE. During this operation, the flash memory device 200 accepts data, that is, a command, by means of the data fetch signal input through the /RWE pin. When the control signals ALE and CLE are conditioned in high and low levels respectively, data input through the input/output pins are regarded as an address. That is, the flash memory device 200 determines a data input/output cycle as an address latch cycle in response to a logical combination with the control signals ALE and CLE. During this operation, the flash memory device 200 accepts data, that is, an address, in sync with the data fetch signal input through the /RWE pin. When the control signals ALE and CLE are all at a low level, data input through the input/output pins are regarded as program data. That is, the flash memory device 200 determines a data input/output cycle as an input data latch cycle in response to a logical combination with the control signals ALE and CLE. This means that the flash memory device 200 accepts data in sync with the data fetch signal input through the /RWE pin. When the control signals ALE and CLE are all at a high level, the flash memory device 200 outputs data in sync with the data fetch signal /RWE. That is, the flash memory device 200 determines a data input/output cycle as a data output cycle in response to a logical combination of the control signals ALE and CLE. In this exemplary embodiment, the data output cycle includes a serial access cycle of a reading operation, a data output cycle of an identification (ID) reading operation, a data output cycle of a state reading operation, and so on.

According to the flash memory system of an exemplary embodiment of the present invention, the flash memory device 200 discriminates data input/output cycles by logical combinations of the control signals ALE and CLE. In a data input cycle, the flash memory device 200 discriminates whether data input through the input/output pins are address, command, or program data with reference to a logical combination of the control signals ALE and CLE.

FIGS. 3A through 3F are timing diagrams showing operations of the flash memory device according to an exemplary embodiment of the present invention.

Figure 3A:
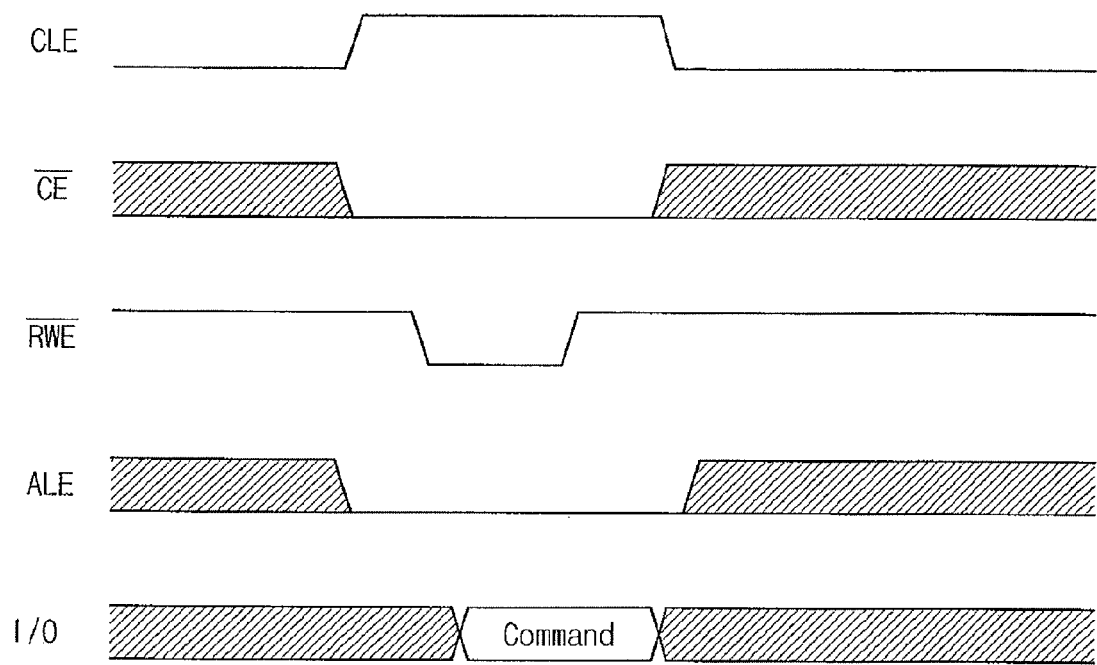
FIGS. 3A through 3F are timing diagrams showing operations of the flash memory device according to an exemplary embodiment of the present invention.
Figure 3B:
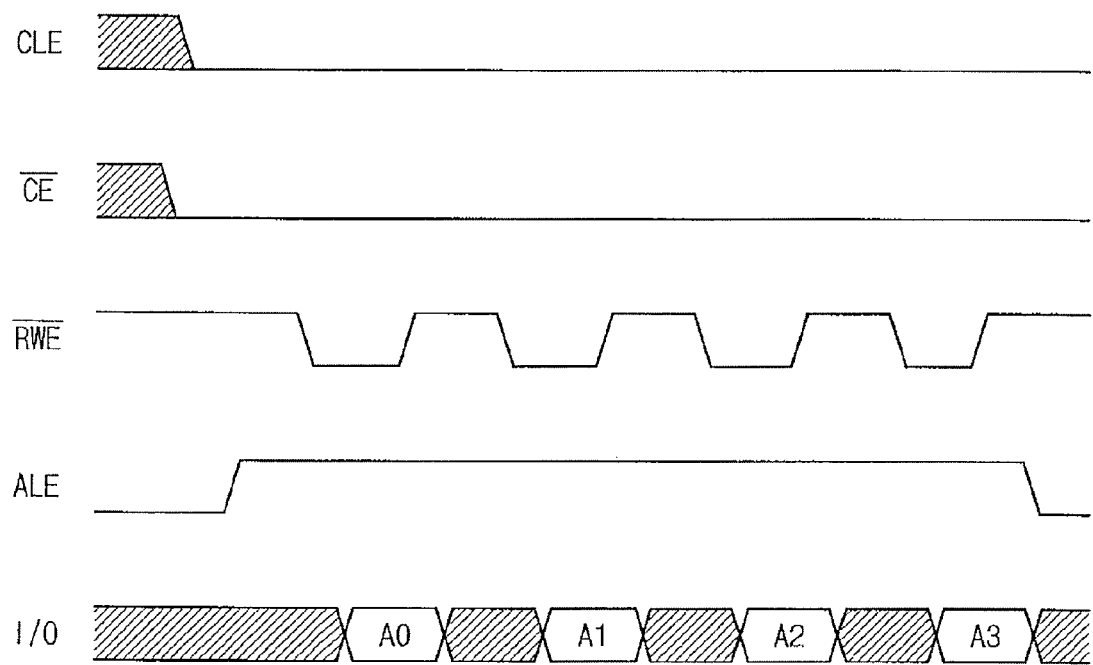
Figure 3C:
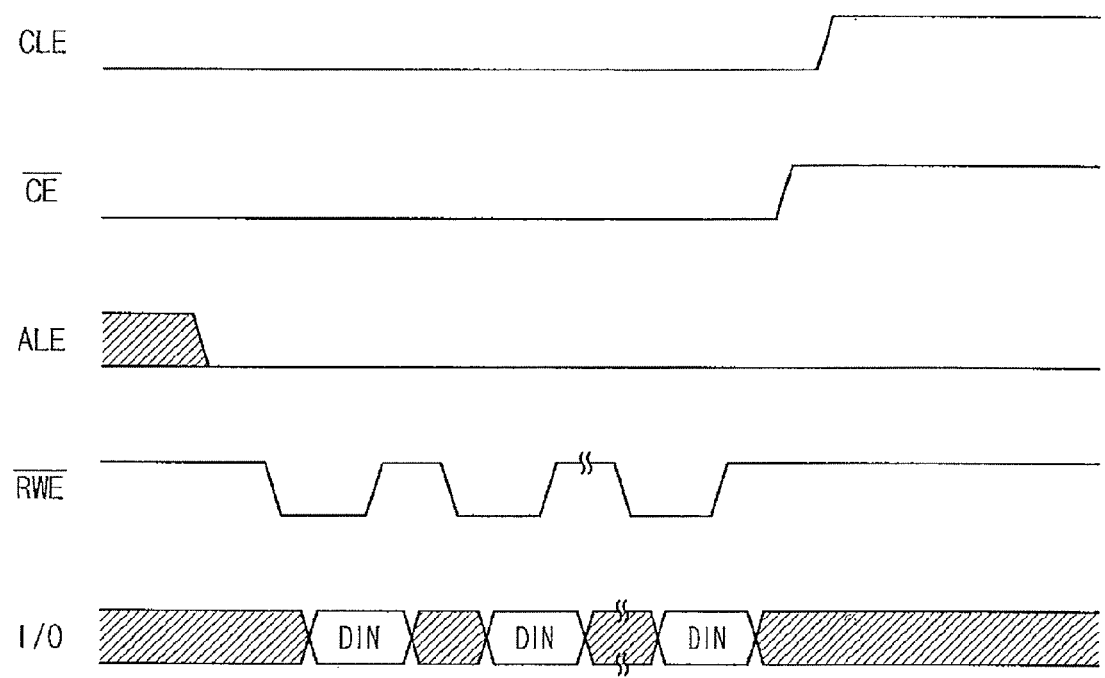

The flash memory device 200 reads a logical combination of the control signals ALE and CLE transferred from the memory controller 100. When the input control signals ALE and CLE have low and high levels respectively, the flash memory device 200 determines a data input/output cycle as a command latch cycle. Thus, as shown in FIG. 3A, the flash memory device 200 inputs data from the input/output pins as a command in sync with the data fetch signal /RWE. If the control signals ALE and CLE have high and low levels respectively, the flash memory device 200, as shown in FIG. 3B, determines a data input/output cycle as an address latch cycle. This means that the flash memory device 200 accepts data from the input/output pins as an address in sync with the data fetch signal /RWE. If the control signals ALE and CLE are all set on a low level, the flash memory device 200 determines a data input/output cycle as an input data latch cycle. Thus, as shown in FIG. 3C, the flash memory device 200 accepts data from the input/output pins as program data in sync with the data fetch signal /RWE. If the control signals ALE and CLE are all set to a high level, the flash memory device 200 determines a data input/output cycle as a serial access cycle (after read) that is a data output cycle. Thus, as shown in FIG. 3D, the flash memory device 200 sequentially outputs data by way of the input/output pins in sync with the data fetch signal /RWE.

Figure 3D:
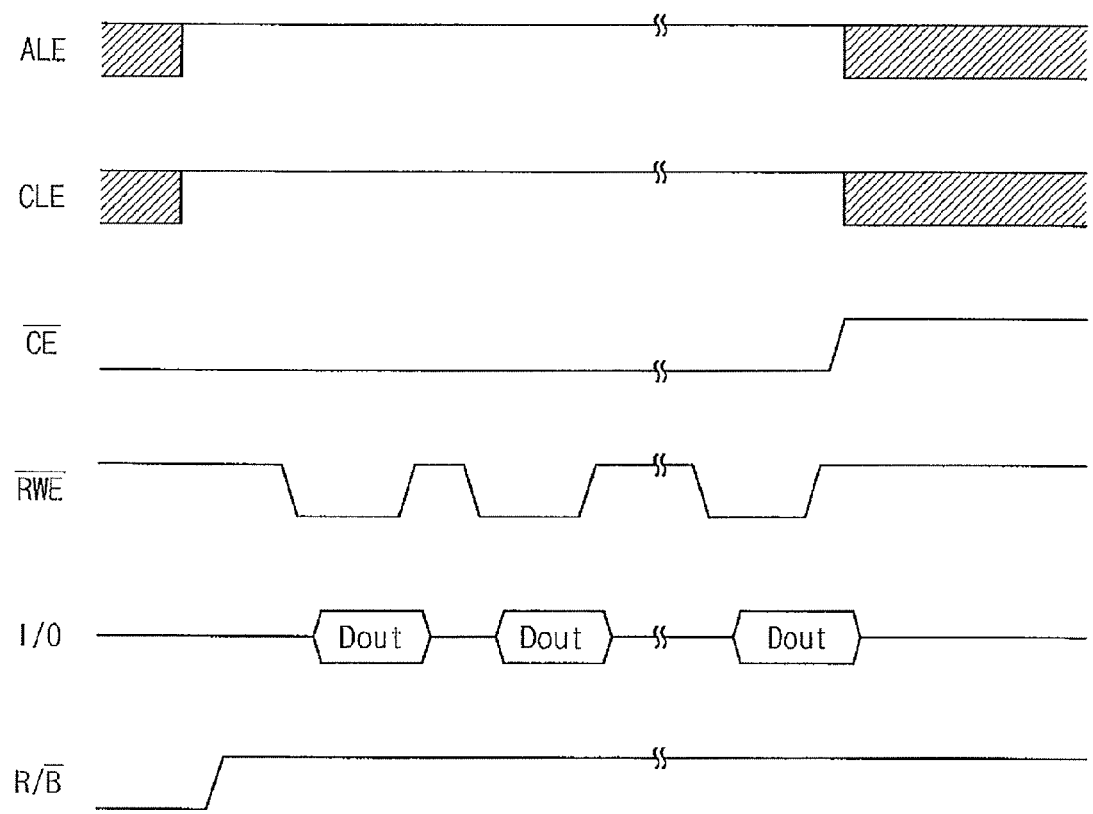
Figure 3E:
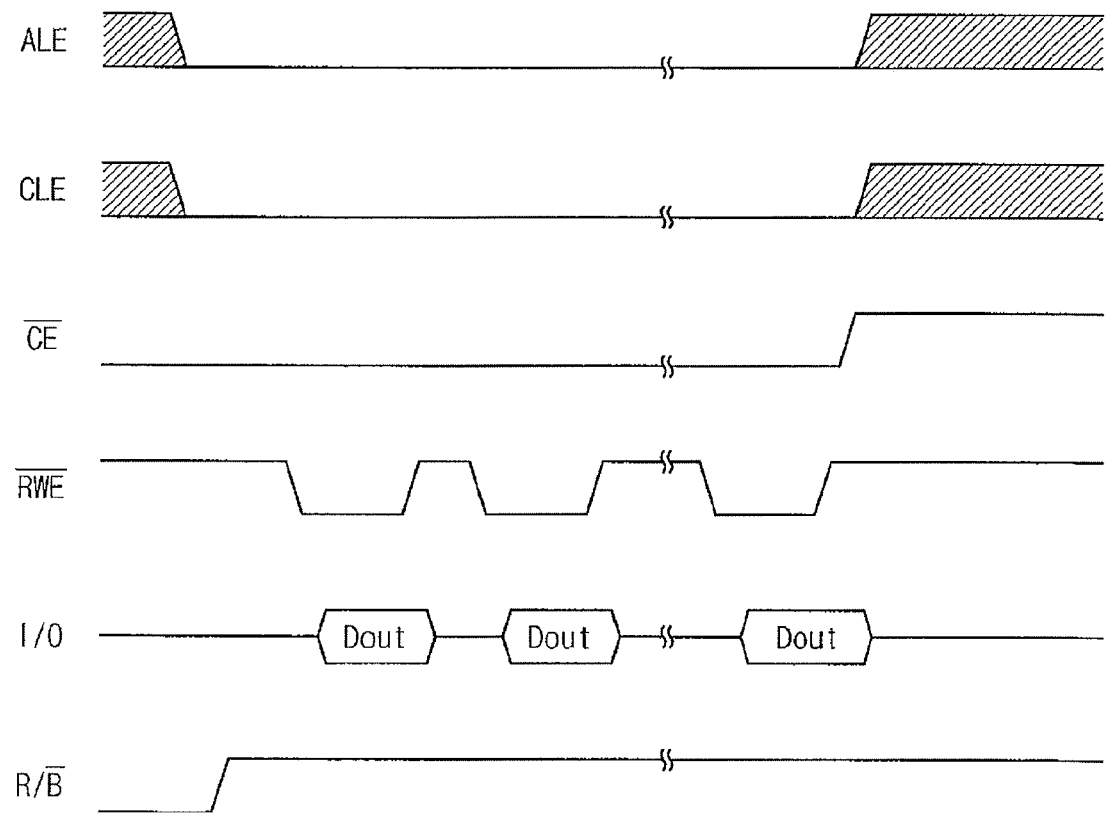
Figure 3F:
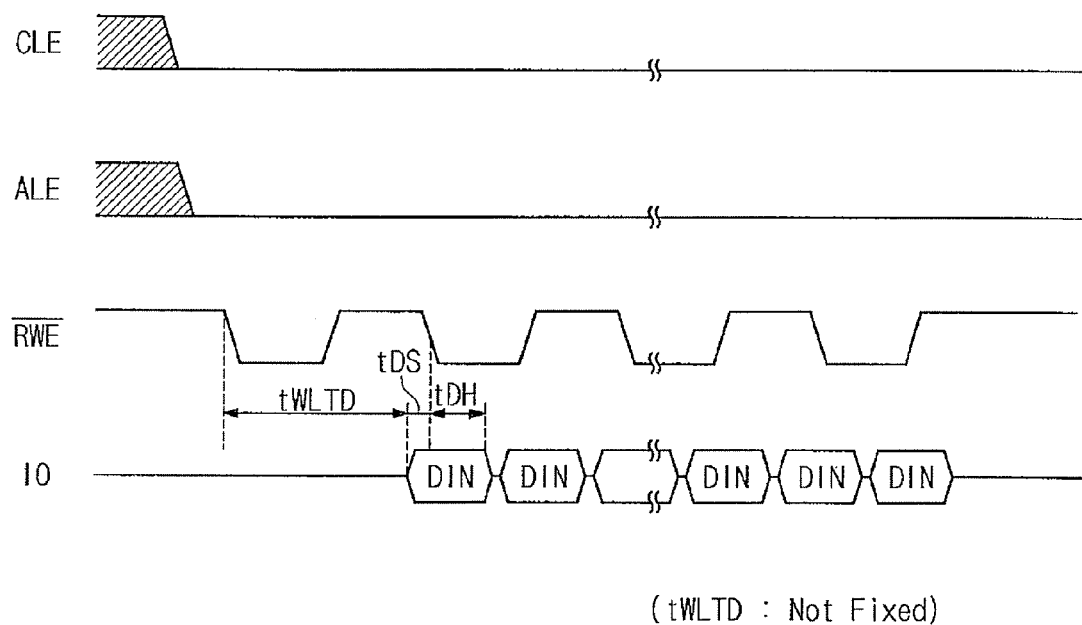

Differing from the timing sequence of FIG. 3D and referring to FIG. 3E, the flash memory device 200 is operable by sequentially outputting data through the input/output pins in sync with the data fetch signal /RWE under the condition that the control signals ALE and CLE are set on a low level. On the other hand, as shown in FIG. 3F, the flash memory device 200 is able to sequentially output data through the input/output pins in sync with the rising and falling edges of the data fetch signal /RWE.

Owing to the unified data fetch scheme and the discrimination mode of data input/output cycle in accordance with the control signals ALE and CLE, it is possible to reduce the numbers of pins in the memory controller and the flash memory device. Although the unified clocking scheme is applied to the flash memory system according to an exemplary embodiment of the present invention, the modes shown in FIGS. 3A through 3F may be helpful in smoothly transferring an address, a command, and data during a reading, programming, or erasing operation.

As can be seen from the aforementioned, the flash memory system according to an exemplary embodiment of the present invention easily conducts an interfacing operation by a single one of the data fetch signal /RWE instead of the two signals /RE and /WE, thereby reducing the number of pins. In this case, a data input/output cycle to data/address/command is determined in operation type by a logical combination of the control signals ALE and CLE. Differing from the aforementioned mode, it is possible to determine an operation type of the data input/output cycle to data/address/command by means of an input command.

Figure 4:
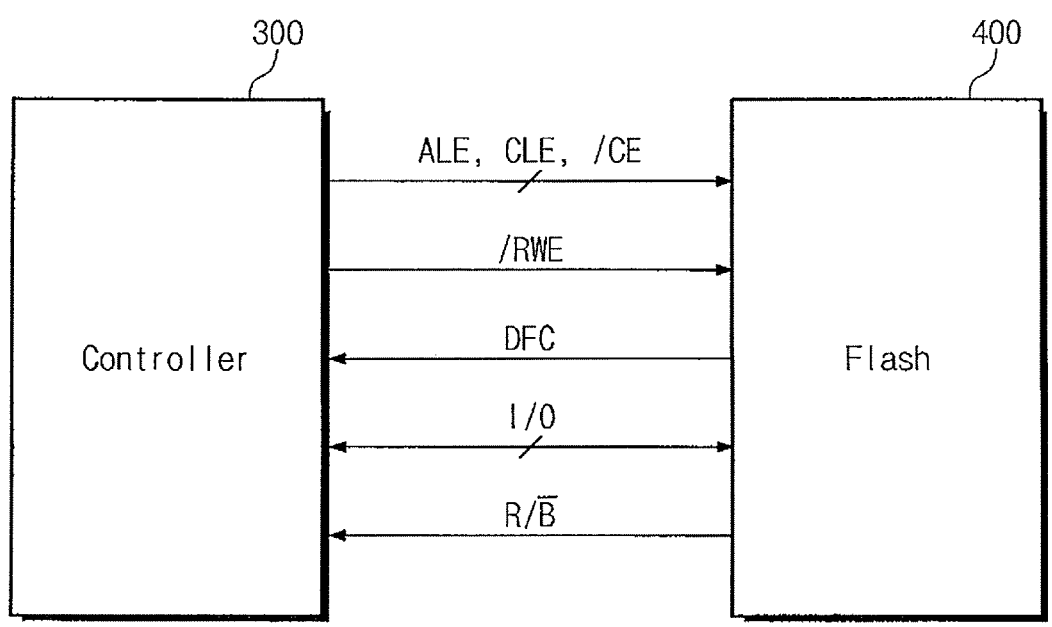
FIG. 4 is a schematic block diagram of a flash memory system according to an exemplary embodiment of the present invention.

FIG. 4 is a schematic block diagram of a flash memory system according to an exemplary embodiment of the present invention.

Referring to FIG. 4, the flash memory system shown in FIG. 4 is practically the same as that shown in FIG. 1, however, with the following difference. A flash memory device 400 of FIG. 4 generates a data fetch signal DFC, hereinafter referred to as 'second data fetch signal', by means of the signal /RWE, hereinafter referred to as 'first data fetch signal', during a data output cycle, for example, a serial access cycle, and outputs data to a memory controller 300 along with the second data fetch signal DFC. The flash memory device 400 outputs data to the memory controller 300 together with the second data fetch signal DFC in an edge alignment mode and the DDR (double data rate) mode. The memory controller 300 fetches data from the flash memory device 400 in response to the second data fetch signal DFC. The memory controller 300 safely fetches data from the flash memory device 400, regardless of an interval (transfer length) between the memory controller 300 and the flash memory device 400. More specifically, a data transmission mode according to an exemplary embodiment of the present invention may be useful for a memory structure, for example, solid state disk, memory module, memory card, and the like where a plurality of flash memory devices are coupled to a single channel in parallel. This is because such a memory structure is configured such that the flash memory devices are distanced from the memory controller in different intervals, that is, there are different transfer lengths. If the intervals from the memory controller are different from each other, it is reasonable to assume they cause gaps on data transmission times from the flash memory devices to the memory controller. This means that there is a requirement for securing a wider data fetch margin for the purpose of stably fetching data from the flash memory devices. Such a data fetch margin may act as a limitation on fast data transmission. In other words, it would not be easy to accomplish fast data transmission in the structure, such as a solid state disk (SSD) or memory module, without using the data fetch signal according to exemplary embodiments of the present invention. An exemplary embodiment of the present invention is born out of the need to consider a data fetch margin, because the data fetch signal is transferred to the memory controller from the flash memory device. Because of that, the data transmission scheme of the flash memory system according to an exemplary embodiment of the present invention may be useful for fast (or high frequency) data transmission.

As can be seen from the above description, the flash memory system shown in FIG. 4 may be advantageous in implementing fast data transmission by means of the second data fetch signal DFC at the same time with a smooth progress of the interfacing operation by means of the first data fetch signal /RWE.

Figure 5:
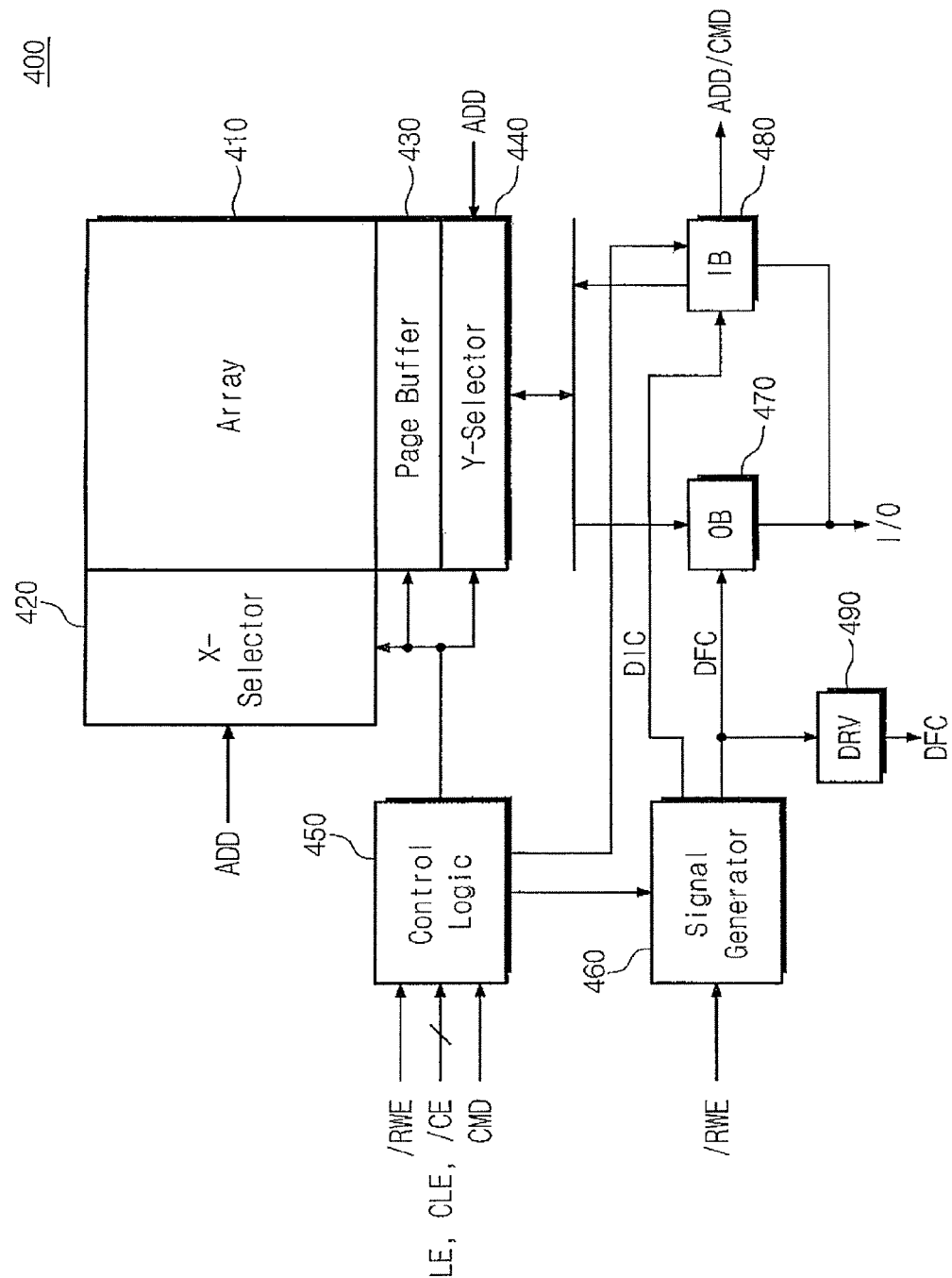
FIG. 5 is a schematic block diagram of a flash memory device according to an exemplary embodiment of the present invention.

FIG. 5 is a schematic block diagram of a flash memory device according to an exemplary embodiment of the present invention.

Referring to FIG. 5, the flash memory device 400 includes a memory cell array 410 storing N-bit data, where N is 1 or an integer larger than 1. The memory cell array 410 includes memory cells arranged in rows and columns. Although not shown in FIG. 5, each memory cell may be formed of a nonvolatile memory cell such as a floating-gate memory cell, charge-trap flash memory cell, or phase-change memory cell. A row selector (X-selector) 420 is operated by a control logic circuit 450, for selecting a row of the memory cell array 410 in response to an address, for example, row address, input through an input buffer circuit 480. As well known, a page buffer circuit 430 functions as a sense amplifier circuit or writing driver circuit controlled by the control logic circuit 450. A column selector (Y-selector) 440 is operated by the control logic circuit 450, for selecting columns, or page buffers of the page buffer circuit 430, in a predetermined unit, for example, ×8, by responding to an address, for example, a column address, input through the input buffer circuit 480.

Still referring to FIG. 5, the control logic circuit 450 is configured to control an overall operation of the flash memory device 400. More specifically, the control logic circuit 450 operates to discriminate a data input/output cycle in response to a logical combination with the control signals ALE and CLE. As aforementioned, when the control signals ALE and CLE are conditioned on low and high levels respectively, the flash memory device 400 determines a data input/output cycle as a command latch cycle. When the control signals ALE and CLE are conditioned on high and low levels respectively, the flash memory device 400 determines a data input/output cycle as an address latch cycle. When the control signals ALE and CLE are both conditioned on the low level, the flash memory device 400 determines a data input/output cycle as an input data latch cycle. When the control signals ALE and CLE are both conditioned on the high level, the flash memory device 400 determines a data input/output cycle as a serial access cycle (or data output cycle). More specifically, the control logic circuit 450 operates to control a signal generator 460 in accordance with a result of the determination.

The signal generator 460 receives the first data fetch signal /RWE and generates internal signals under control of the control logic circuit 450. For instance, in the address/command/input data latch cycle, the signal generator 460 outputs an internal signal DIC to the input buffer circuit 480 by means of the first data fetch signal /RWE in response to a signal from the control logic circuit 450. In this exemplary embodiment, the internal signal DIC may have the same waveform as the first data fetch signal /RWE. In the serial access cycle (or the data output cycle), the signal generator 460 outputs the second data fetch signal DFC to an output buffer circuit 470 by means of the first data fetch signal /RWE in response to the control logic circuit 450. At the same time, the second data fetch signal DFC is provided to the memory controller 300 by way of a driver 490. It can be understood by those of ordinary skill in the art that the signal generator 460 additionally generates internal signals, which are necessary for the flash memory device 400, by means of the first data fetch signal /RWE. Exemplarily, the signal generator 460 supplies a clock signal to the column selector 440 by means of the first data fetch signal /RWE during the input data/serial access cycle. As well known, the column selector 440 sequentially generates column addresses in sync with a clock signal (not shown) provided from the signal generator 460.

The output buffer circuit 470 outputs data from the column selector 440 to the input/output pins I/O in the edge alignment manner by responding to the second data fetch signal DFC provided from the signal generator 460. In other words, the output buffer circuit 470 operates in sync with the second data fetch signal DFC, configured to interface data read from the memory cell array 410. Because the second data fetch signal DFC is generated by means of the first data fetch signal /RWE, it is necessary to consider latency between the first and second data fetch signals /RWE and DFC. For example, the second data fetch signal DFC begins to be generated after a predetermined time after a high-to-low transition of the first data fetch signal /RWE (refer to FIG. 8). The output buffer circuit 470 outputs data during low-to-high and high-to-low transition periods of the second data fetch signal DFC. That is, the output buffer circuit 470 outputs data using the DDR mode and the edge alignment mode in sync with the second data fetch signal DFC. Otherwise, the output buffer circuit 470 is able to output data during a low level period or high level period (or a low-to-high transition period) of the second data fetch signal DFC. In other words, the output buffer circuit 470 outputs data even using the SDR mode and the edge alignment mode in sync with the second data fetch signal DFC.

The input buffer circuit 480 operates in response to a signal from the control logic circuit 450, for receiving data as an address/command or program data in sync with the internal signal DIC. That is, the input buffer circuit 480 operates in sync with the internal signal DIC, that is, the first data fetch signal /RWE, being configured to interface data to be transferred to the memory cell array 410. For instance, during the address/command latch cycle, the input buffer circuit 480 receives data through the input/output pins I/O as an address/command in sync with the internal signal DIC. An input address is provided to the row selector 420 and the column selector 440 and an input command is provided to the control logic circuit 450. During the data input cycle, the input buffer circuit 480 accepts data as program data through the input/output pins I/O in sync with the internal signal DIC.

In this exemplary embodiment, the row selector 420, the page buffer circuit 430, and the column selector 440 are controlled by the control logic circuit 450, forming a reading/programming circuit to read data from the memory cell array 410 in the reading operation and to program data into the memory cell array 410 in the programming operation.

For the flash memory system shown in FIG. 1, the flash memory device 200 may include a signal generator configured to output an internal signal to be provided to the output buffer circuit, which is generated by means of the first data fetch signal /RWE instead of the second data fetch signal DFC. In this case, the internal signal applied to the output buffer circuit 480 may not be output externally, that is, to the memory controller 450. Except for this feature, the flash memory device shown in FIG. 1 is practically the same as that shown in FIG. 5.

As seen from the above description, the flash memory device according to an exemplary embodiment of the present invention is organized to discriminate the data input/output cycle with reference to a logical combination of the control signals ALE and CLE and to output the data fetch signal DFC together with data during the serial access cycle (or the data output cycle).

Figure 6:
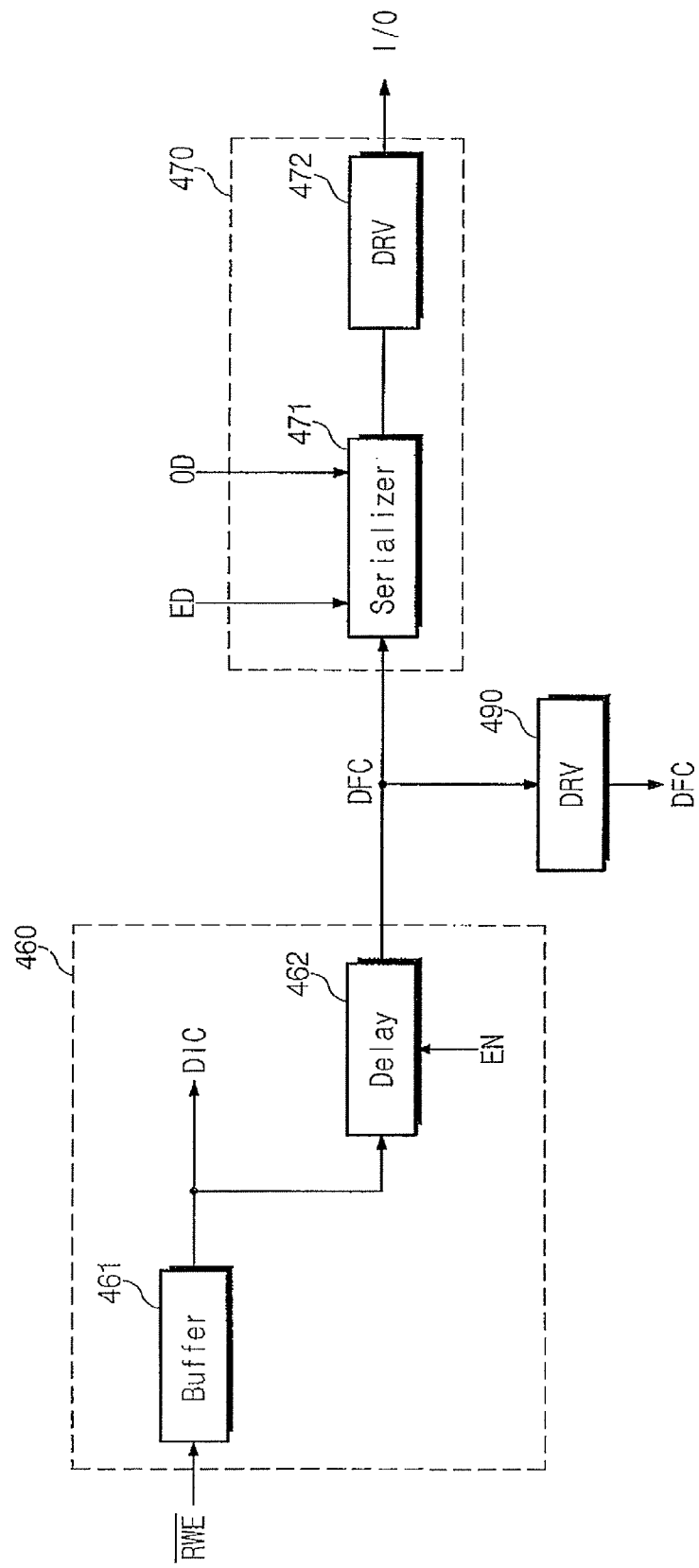
FIG. 6 is a block diagram illustrating the signal generator and output buffer circuit of FIG. 5 in accordance with an exemplary embodiment of the present invention.

FIG. 6 is a block diagram illustrating the signal generator 460 and output buffer circuit 470 of FIG. 5 in accordance with an exemplary embodiment of the present invention.

Referring to FIG. 6, the signal generator 460 includes a buffer 461 and a delay unit 462. The buffer 461 operates to buffer the first data fetch signal /RWE and outputs the buffered signal as the internal signal DIC. As aforementioned, the internal signal DIC is provided to the input buffer circuit 480. The delay unit 462 is activated by an enabling signal EN that is provided from the control logic circuit 450, thereby delaying the output signal DIC of the buffer 461. A delayed version of the internal signal DIC is output as the second data fetch signal DFC. For example, if a data input/output cycle is determined as the data output cycle, the delay unit 462 outputs the second data fetch signal DFC in response to the enabling signal EN.

Referring again to FIG. 6, the output buffer circuit 470 includes a serializer 471 and a driver 472. The serializer 471 receives a pair of data ED and OD from the column selector 440 shown in FIG. 5 and sequentially outputs the input data ED and OD in response to the second data fetch signal DFC from the signal generator 460. For instance, the serializer 471 receives the data ED in sync with a first edge, for example, a high-to-low transition, and then outputs the data ED to the driver 472. Additionally, the serializer 471 receives the data OD in sync with a second edge, for example, low-to-high transition, and then outputs the data OD to the driver 472. In this exemplary embodiment, the number of data bits comprising each data (ED or OD) is set to correspond with the number of the input/output lines.

Figure 7:
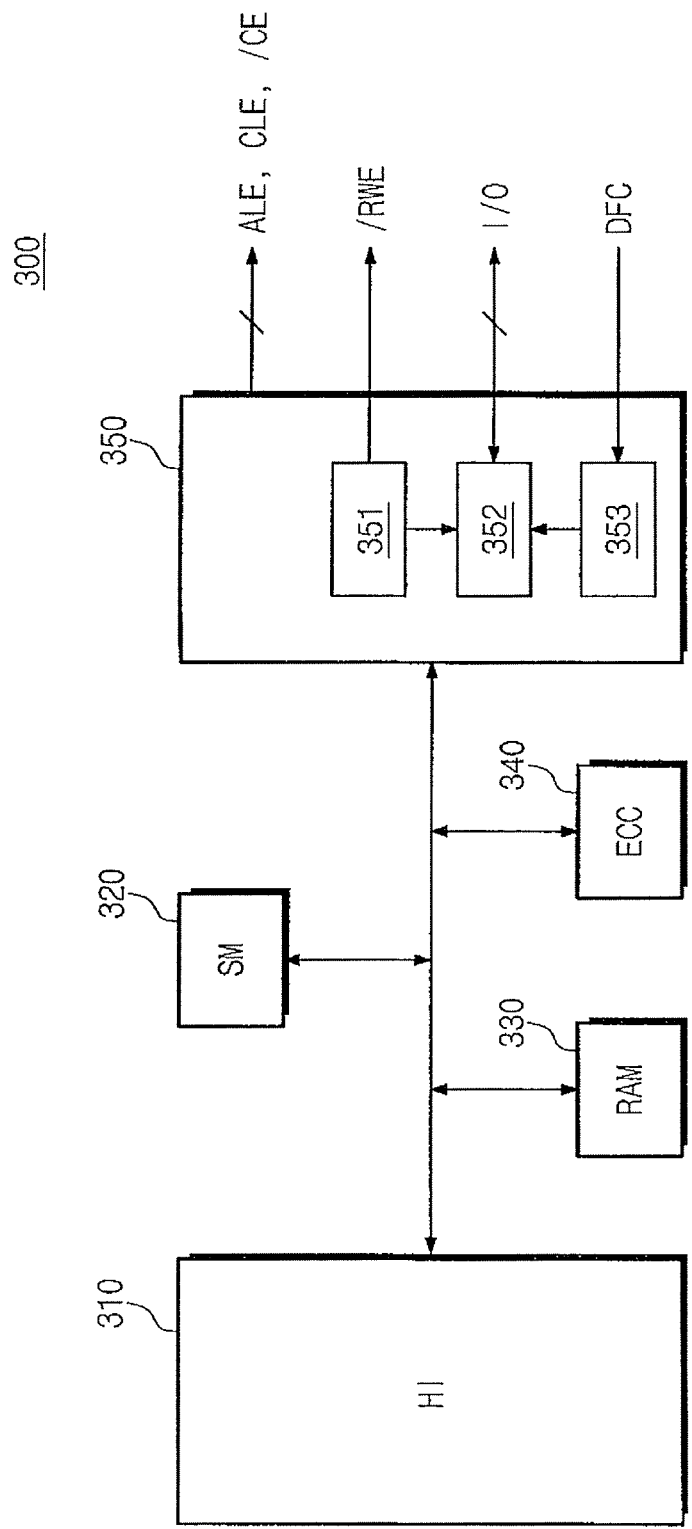
FIG. 7 is a block diagram of the memory controller according to an exemplary embodiment of the present invention.

FIG. 7 is a block diagram of memory controller such as shown at 100 in FIG. 1 according to an exemplary embodiment of the present invention.

Referring to FIG. 7, the memory controller 300 is comprised of a host interface 310, a state machine 320, a random access memory (RAM) 330, an error correction circuit (ECC) 340, and a flash interface 350. The host interface 310 is provided for an interfacing operation with a host, for example, computer, portable terminal, and the like. The state machine 320 is configured to control an overall operation of the memory controller 300. The state machine 320 may be formed of a processor. The RAM 330 is used for temporarily storing data that is to be transferred to the flash memory device 400 or read from the flash memory device 400. The RAM 330 may also be used as a working memory of the state machine 320. The RAM 330 is made up with a dynamic or static RAM. The ECC 340 is configured to generate error check and correction data from the data that is to be transferred into the flash memory device 400, and to detect and correct errors of the data that is read from the flash memory device 400.

Continuing on with FIG. 7, the flash interface 350 is provided for performing an interfacing operation with the flash memory device 400. The flash interface 350 generates the control signals ALE, CLE, and /CE, and the data fetch signal /RWE in response to the state machine 320. In particular, as aforementioned, the flash interface 350 generates the unified data fetch signal /RWE instead of the two signals /RE and /WE. The flash interface 350 transfers data (address, command, or program data) through the input/output lines I/O in sync with the first data fetch signal /RWE. Additionally, the flash interface 350 receives data from the flash memory device 400. The flash interface 350 is organized by including a clock generator 351, an input/output buffer 352, and an input buffer 353. The clock generator 351 is configured to generate the first data fetch signal /RWE and the input buffer 353 is configured to receive the second data fetch signal DFC. The input/output buffer 352 operates in sync with the first data fetch signal /RWE during an output cycle, and it operates in sync with the second data fetch signal DFC during an input cycle.

As aforementioned, because the data fetch signal DFC is transferred to the memory controller 300 from the flash memory device 400, there is no need to consider a data fetch margin. For that reason, the data transmission scheme of the flash memory system according to an exemplary embodiment of the present invention is useful in implementing fast data transmission.

Figure 8:
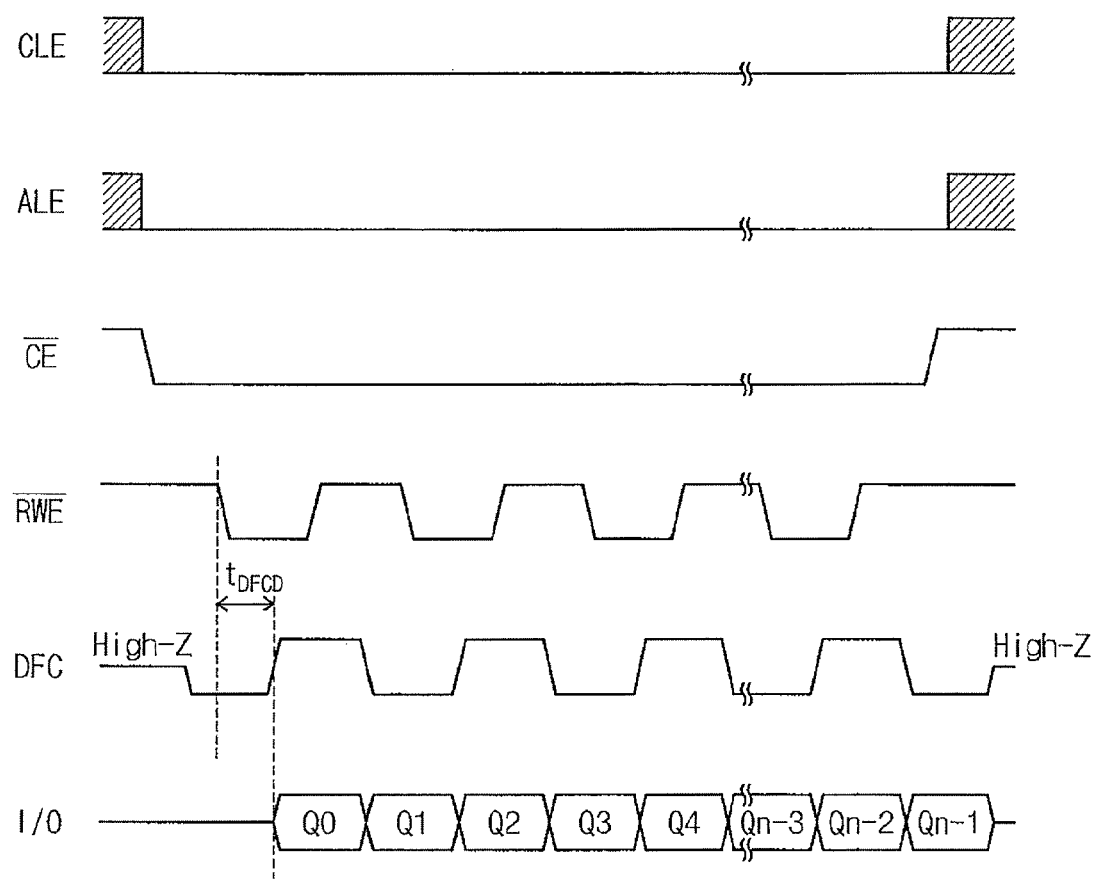
FIG. 8 is a timing diagram showing a reading operation of the flash memory system according to an exemplary embodiment of the present invention.

FIG. 8 is a timing diagram showing the reading operation of the flash memory system according to an exemplary embodiment of the present invention.

A command and an address are transferred to the flash memory device 400 from the memory controller 300 by predetermined timings in the command and address latch cycles described above relative to FIGS. 3A and 3B. Once the command and address are transferred to the flash memory device 400, the reading operation begins. As a result of the reading operation, data of a selected row or page are stored in the page buffer circuit 430. Afterward, the data are sequentially transferred to the memory controller 300 from the flash memory device 400 in a predetermined unit. More specifically, as shown in FIG. 7, the memory controller 300 sets the control signals ALE and CLE all on high level. As the control signals ALE and CLE are all set to the high level, the flash memory device 400 shown in FIG. 5 determines a data input/output cycle as the serial access cycle. This means that the signal generator 460 of the flash memory device 400 generates the second data fetch signal DFC by means of the first data fetch signal /RWE. As illustrated in FIG. 8, in order to output data in the edge alignment mode, a value of latency tDFCD should be predetermined between the first and second data fetch signals /RWE and DFC. As the signal generator 460 provides the second data fetch signal DFC, the output buffer circuit 470 outputs data sequentially in sync with the second data fetch signal DFC by the edge alignment mode. During this operation, the memory controller 300 receives data from the flash memory device 400 in sync with the second data fetch signal DFC.

As shown in FIG. 8, the second data fetch signal DFC is maintained on a high impedance state (high-Z) in the periods out of the serial access cycle.

Figure 9:
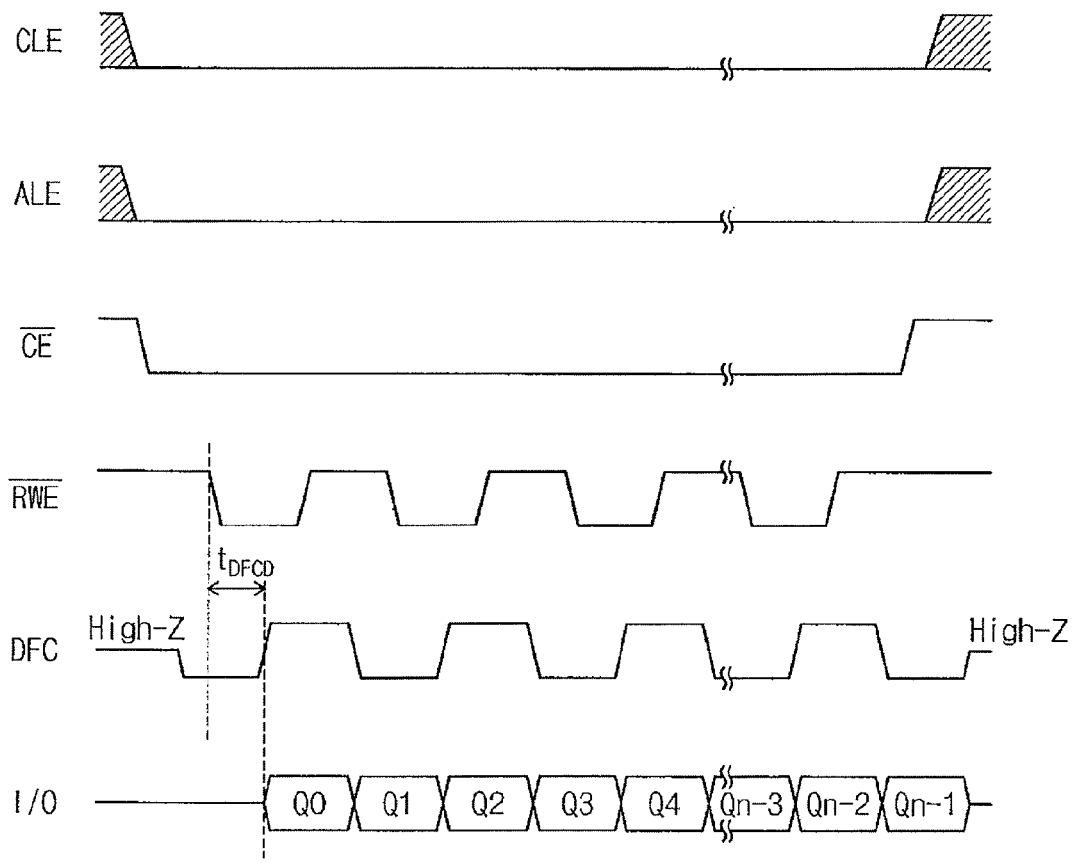
FIG. 9 is a timing diagram showing a reading operation of the flash memory system according to an exemplary embodiment of the present invention.

Under the condition that the control signals ALE and CLE are all set on a high level, data are output in sync with the second data fetch signal DFC. On the other hand, as shown in FIG. 9, it is also permissible to configure the flash memory device of an exemplary embodiment of the present invention to be capable of outputting data in sync with the second fetch signal DFC under the condition that the control signals ALE and CLE are all set on a low level.

Figure 10:
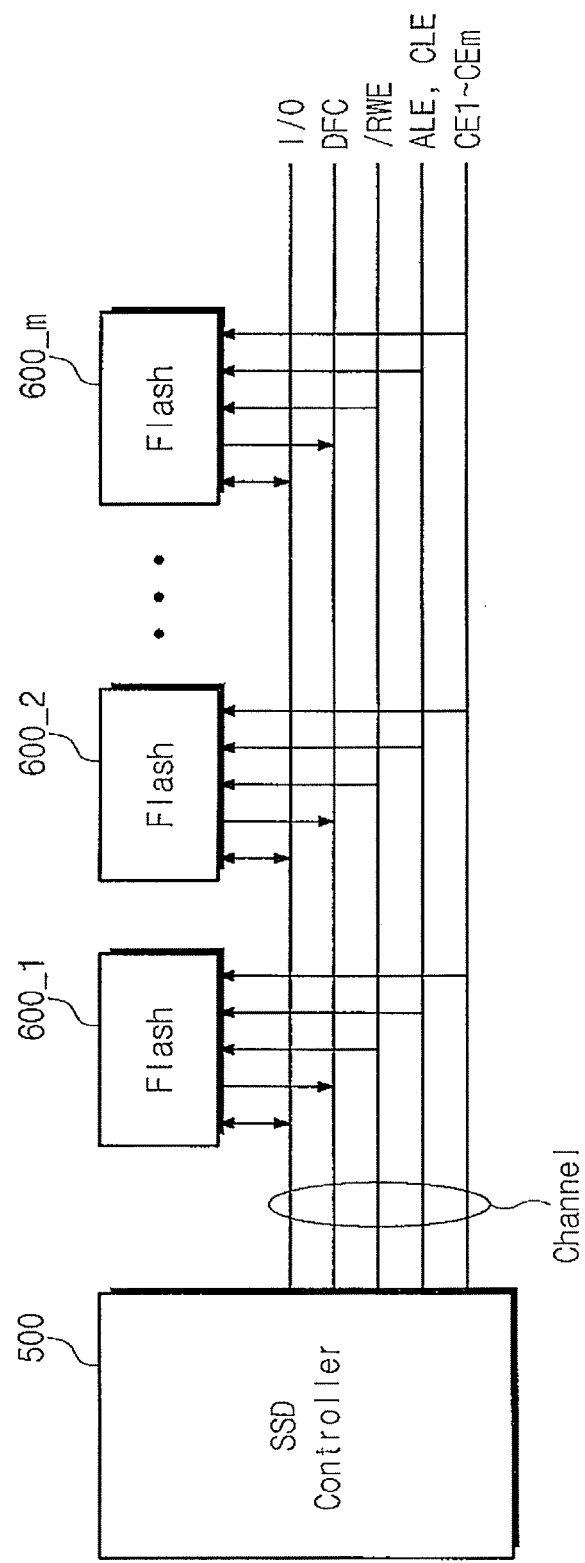
FIG. 10 is a block diagram illustrating an application with the flash memory system to an SSD in accordance with an exemplary embodiment of the present invention.

The flash memory system according to an exemplary embodiment of the present invention is applicable to, for example, a memory module, a solid state drive (SSD), a memory card, or so forth. Referring to FIG. 10 showing an application that the flash memory system according to an exemplary embodiment of the present invention is configured to be an SSD, the SSD is comprised of an SSD controller 500 and a plurality of flash memory devices 600_1~600_m. Each of the flash memory devices 600_1~600_m is substantially the same as that shown in FIG. 5, so it will not be further described. The flash memory devices 600_1~600_m are electrically connected to the SSD controller 500 so as to share the input/output lines, the first and second data fetch signals /RWE and DFC, and the control signals ALE and CLE. Furthermore, the plural flash memory devices 600_1~600_m are electrically connected to the SSD controller 500, so as to receive respective control signals /CE1~/CEm corresponding thereto.

As aforementioned, in the flash memory system shown in FIG. 10, as the data fetch signal DFC is transferred to the SSD controller 500 from each flash memory device, there is no need of considering a data fetch margin. For that reason, the data transmission scheme of the SSD shown in FIG. 10 is advantageous for fast data transmission.

Figure 11:
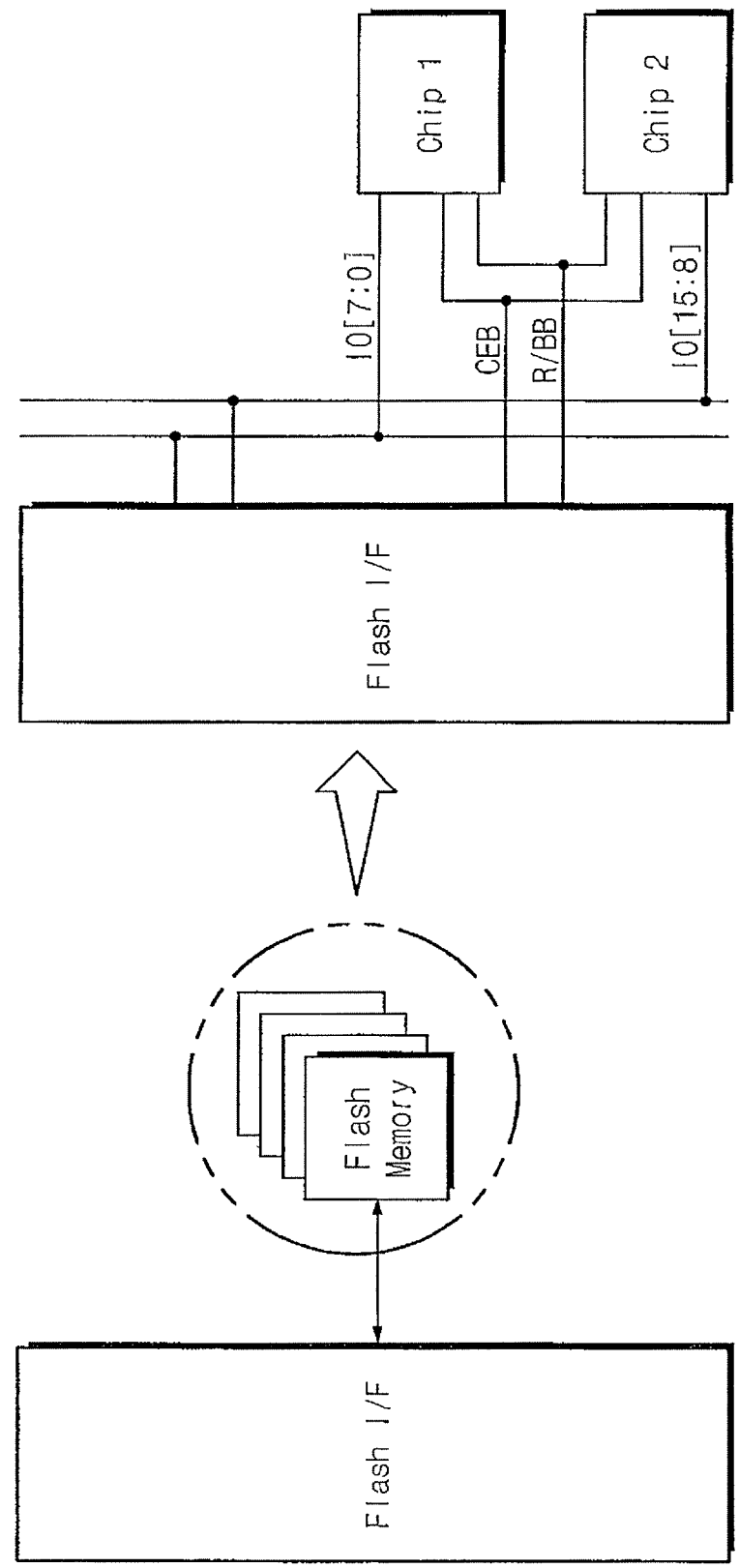
FIG. 11 is a block diagram illustrating a channel structure operable with the flash memory system according to an exemplary embodiment of the present invention.

FIG. 11 is a block diagram illustrating a channel structure operable with the flash memory system according to an exemplary embodiment of the present invention.

Referring to FIG. 11, a flash memory device of ×16 architecture can be made up by connecting flash memory devices of ×8 architecture in parallel. According to this channel structure, it is possible to extend by two times the number of the flash memory devices and correspondingly increase the capacity of the flash memory system. It will be seen by those of ordinary skill in the art that the channel structure shown in FIG. 11 is applicable to the SSD shown in FIG. 10. One of two chips, for example, Chip 1, uses the input/output lines IO[7:0] while the other chip (Chip 2) uses the other input/output lines IO[15:8]. In this exemplary embodiment, all of the control signals, for example, /CE, ALE, CLE, R/BB, /RWE, and DFC, need to be shared by the two chips. Furthermore, the flash interface and the flash memory device are configured to employ the same scheme as described hereinabove with regard to FIGS. 5 and 7.

By providing a delay circuit to the memory controller in correspondence with a transmission delay time between the flash memory device and the memory controller, it is possible to implement fast data transmission without using a data fetch signal. In other words, it is possible to fetch data from the flash memory device by means of the signal /RWE delayed through the delay circuit, after measuring a transmission delay time between the flash memory device and the memory controller and programming the delay circuit in correspondence with the measured transmission delay time.

Figure 12:
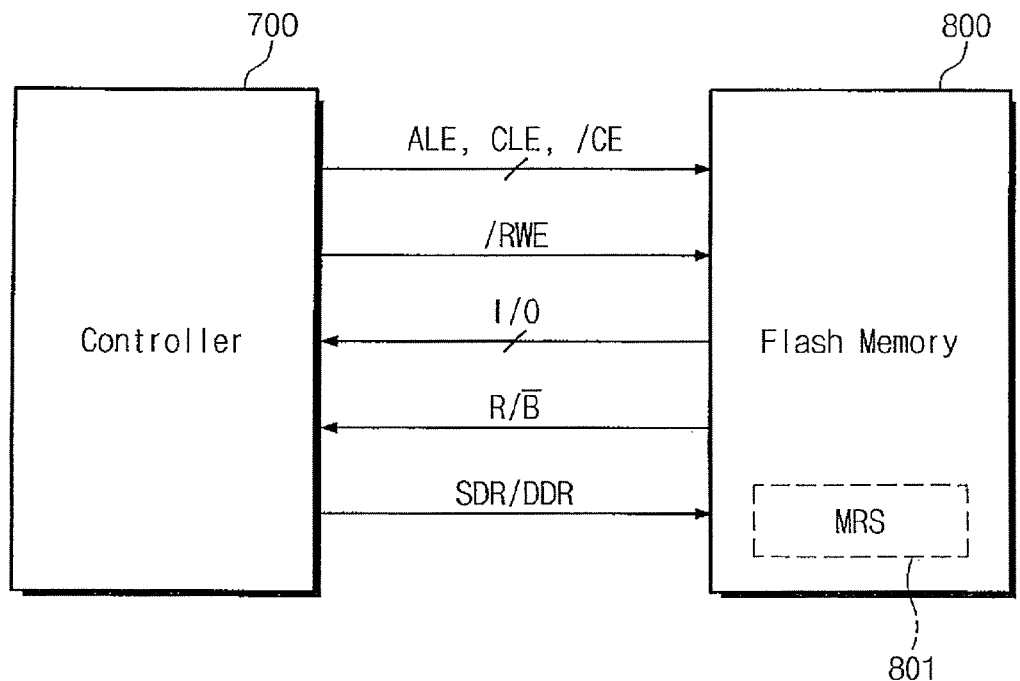
FIG. 12 is a schematic block diagram of a memory system according to an exemplary embodiment of the present invention.

FIG. 12 is a schematic block diagram of a memory system according to an exemplary embodiment of the present invention.

Referring to FIG. 12, the memory system according to an exemplary embodiment of the present invention includes a memory controller 700 and a flash memory device 800. The flash memory device 800 shown in FIG. 12 is practically the same as that shown in FIG. 1 or 4, but different in the following feature. The flash memory device 800 shown in FIG. 12 is operable in the SDR mode where data is input and output in sync with a rising or falling edge of the data fetch signal /RWE, and also operable in the DDR mode where data is input and output in sync with rising and falling edges of the data fetch signal /RWE. Such functional modes are selected by a selection signal SDR/DDR. When the selection signal SDR/DDR indicates the SDR mode, the flash memory device 800 receives data in sync with a rising or falling edge of the data fetch signal /RWE. When the selection signal SDR/DDR indicates the DDR mode, the flash memory device 800 receives data in sync with rising and falling edges of the data fetch signal /RWE.

To set the SDR and DDR modes, the flash memory device 800 may employ a mode register set (MRS) circuit 801 for use instead of the selection signal SDR/DDR. The SDR and DDR modes are alternatively conducted by setting the MRS circuit 801 in response to a command corresponding thereto. For instance, in changing the operation pattern from the SDR mode to the DDR mode, or from the DDR mode to the SDR mode, the MRS circuit 801 is set by the command corresponding to the DDR or SDR mode. Once the MRS circuit 801 is set to conduct the DDR or SDR mode, the flash memory device 800 operates to interface with the memory controller 700 in the selected DDR or SDR mode.

Nevertheless, an address and a command of an operation mode type in the flash memory device 800 are basically introduced thereto in the SDR mode. It is also permissible, however, for an address and a command to be input into the flash memory device 800 in the DDR mode.

In this exemplary embodiment, the flash memory device 800 operates in the SDR mode as a default.

Furthermore, in this exemplary embodiment, the aforementioned mode change is conducted by the memory controller 700.

Figure 13:
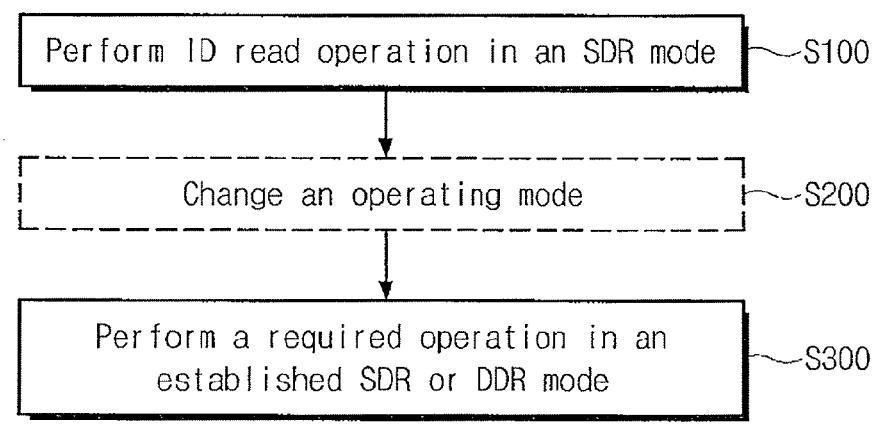
FIG. 13 is a flow chart illustrating an operation of the memory system shown in FIG. 12 in accordance with an exemplary embodiment of the present invention.

FIG. 13 is a flow chart illustrating an operation of the memory system shown in FIG. 12 in accordance with an exemplary embodiment of the present invention. Hereinafter will be detailed the operation of the memory system shown in FIG. 12 in conjunction with the accompanying figures.

As described above, a default mode of the flash memory device 800 shown in FIG. 12 is set to the SDR mode. According to this condition, the ID reading operation is first conducted in the SDR mode (S100). Here, as well known by those of ordinary skill in the art, the ID reading operation is carried out to read information, such as maker code, device code, internal chip number, cell type, the number of pages programmed at a time, page size, block size, redundant area size, the least serial access, plan number, plan size, and so on.

Next, the operation mode is selectively changed (S200). For instance, if it is still desired to maintain the SDR mode, which is the default mode, in the flash memory device 800 even after the ID reading operation, the process for changing the operation mode will be skipped over. Otherwise, if there is a need to turn the operation mode of the flash memory device 800 from the SDR to the DDR as the default mode after the ID reading operation, the flash memory device 800 is converted in operation mode by means of one of the aforementioned ways, that is, the selection signal SDR/DDR or the MRD circuit 801 (S200). Then, a required operation of the flash memory device 800 is conducted in the SDR or DDR mode that has been established (S300).

In an exemplary embodiment, even in the case of maintaining the flash memory device 800 on the SDR mode as the default mode, the procedure for setting the SDR mode may be carried out by the aforementioned way, that is, by the MRS circuit 801 or the selection signal SDR/DDR.

Figure 14:
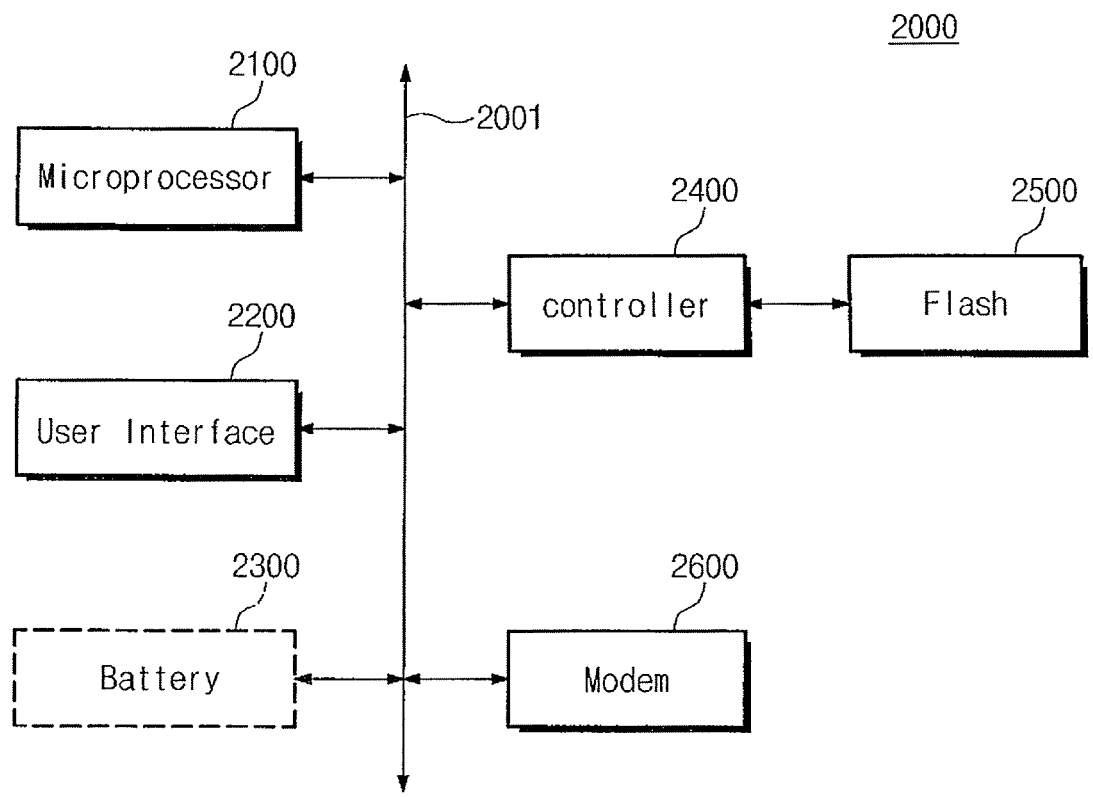
FIG. 14 is a schematic block diagram of a computing system including the flash memory device and memory controller according to an exemplary embodiment of the present invention.

Flash memory devices are kinds of nonvolatile memories capable of keeping data stored therein even without a power supply. With a rapid increase of using mobile apparatuses such as cellular phones, personal digital assistants (PDA), digital cameras, portable gaming consoles, and MP3, the flash memory devices are widely employed as code storage, as well as data storage. The flash memory devices may be also utilized in home applications such as high-definition televisions, digital versatile disks (DVDs), routers, and global positioning systems (GPSs). A schematic structure of a computing system including the flash memory device and memory controller according to the present invention is illustrated in FIG. 14. The computing system according to an exemplary embodiment of the present invention is organized to include a microprocessor 2100, a user interface 2200, a modem 2600 such as a baseband chipset, a memory controller 2400, and a flash memory device 2500, all of which are electrically connected to a bus 2001. The flash memory device 2500 may be configured substantially the same as that shown in FIG. 1 or 4. The memory controller 2400 may be configured substantially the same as that shown in FIG. 1 or 7. In the flash memory device 2500, N-bit data (N is a positive integer) that is processed or is to be processed by the microprocessor 2100 may be stored through the memory controller 2400. If the computing system shown in FIG. 14 is a kind of mobile apparatus, it may be further comprised of a battery 2300 for supplying power thereto. Although not shown in FIG. 14, the computing system may be further equipped with an application chipset, a camera image processor, for example, a complementary metal-oxide-semiconductor (CMOS) image sensor; that is, a CIS, a mobile DRAM, and so forth. The memory controller 2400 and the flash memory device 2500, for example, may constitute an SSD using nonvolatile memories.

Figure 15:
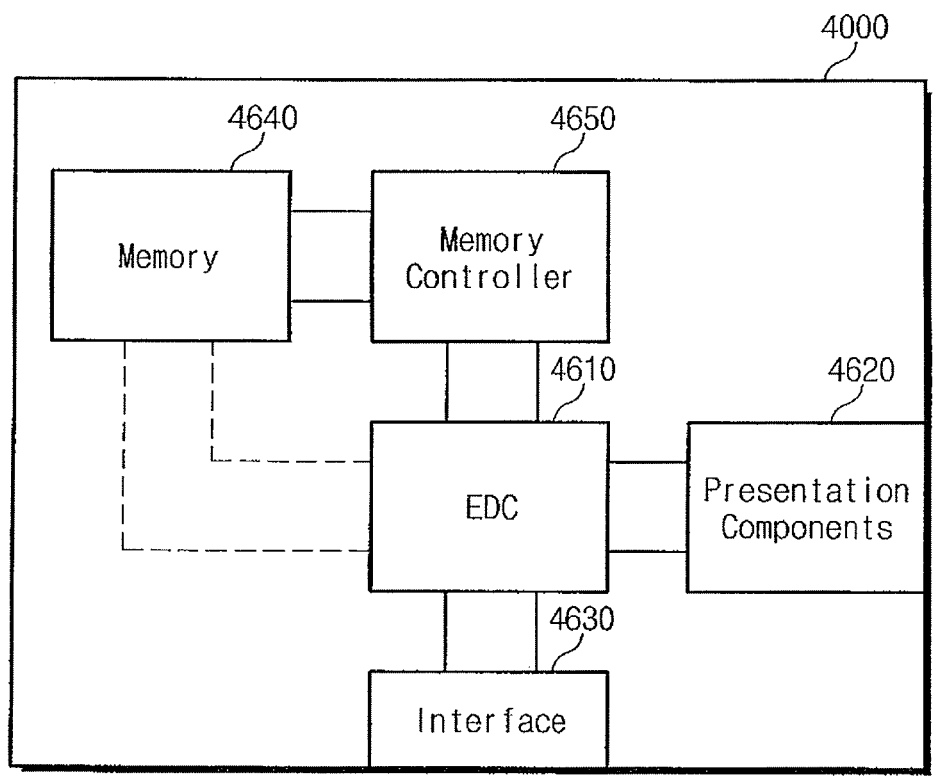
FIG. 15 is a block diagram of a memory system according to an exemplary embodiment of the present invention.

FIG. 15 is a block diagram of a memory system according to an exemplary embodiment of the present invention.

The system shown in FIG. 15 denotes a portable apparatus 4000. The portable apparatus 4000 may be an MP3 player, a video player, a combination video and audio player, or so on. As shown in FIG. 15, the portable apparatus 4000 includes a memory 4640 and a memory controller 4650 that are practically the same as those shown FIG. 1 and/or FIG. 12. The portable apparatus 4000 may further include an encoder and decoder 4610, presentation components 4620, and an interface 4630.

Data (video, audio, and the like) processed by the encoder and decoder (EDC) 4610 can be input to the memory 4640, through the memory controller 4650, and output from the memory 4640. As illustrated by dotted lines in FIG. 15, data can be input directly into the memory 4640 from the EDC 4610 and/or output directly into the EDC 4610 from the memory 4640.

The EDC 4610 is able to encode data in order to store the data into the memory 4640. For instance, the EDC 4610 is also able to conduct an MP3 encoding operation with audio data in order to store the data in the memory 4640. In another operation, the EDC 4610 is able to conduct an MPEG encoding operation, for example, MPEG2, MPEG4, and the like, with video data in order to the data in the memory 4640. Additionally, the EDC 4610 may include pluralities of encoders for encoding data of other types in accordance with other data formats. For example, the EDC 4610 may include an MP3 encoder for audio data and an MPEG encoder for video data.

The EDC 4610 is able to decode an output of the memory 4640. For instance, the EDC 4610 is able to conduct an MP3 decoding operation with audio data output from the memory 4640. In another operation, the EDC 4610 is able to conduct an MPEG decoding operation, for example, MPEG2, MPEG4, and the like, with video data output from the memory 4640. Furthermore, the EDC 4610 may include pluralities of decoders for decoding data of other types in accordance with other data formats. For instance, the EDC 4610 may include an MP3 decoder for audio data and an MPEG decoder for video data.

It can be also understood that the EDC 4610 may include decoders only. For example, previously encoded data can be received by the EDC 4610 and passed through the memory controller 4650 and/or the memory 4640.

The EDC 4610 is able to receive data for encoding by way of the interface 4630 or to receive previously encoded data. The interface 4630 may be in accord with a known standard, for example, firmware, USB, and the like. The interface 4630 may further include more than one interface unit. For instance, the interface 4630 may include a firmware interface, a USB interface, and so on. Data from the memory 4640 may even be output by way of the interface 4630.

The presentation components 4620 are able to display data output from the memory and/or decoded by the EDC 4610. For instance, the presentation components 4620 may include a speaker jack for outputting audio data, a display screen for outputting video data, and so on.

The flash memory and/or the memory controller according to exemplary embodiments of the present invention can be mounted on the aforementioned system or apparatus by way of various types of packages. For instance, the flash memory and/or the memory controller may be placed thereon by any package type, for example, Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A nonvolatile memory device comprising:
a nonvolatile memory cell array including a plurality of nonvolatile memory cells; and
a peripheral circuit configured to receive an address through input/output pins during an address input cycle, to read data from the nonvolatile memory cell array based on the address, and to output the data read from the nonvolatile memory cell array through the input/output pins during a data output cycle,
wherein the peripheral circuit is configured to select one of a first alignment type and a second alignment type,
the peripheral circuit is configured to receive a first signal toggling between a high level and a low level, and to output a second signal toggling between a high level and a low level during the data output cycles,
the peripheral circuit is configured to receive the address in synchronization with one of a rising edge and a falling edge of the first signal regardless of whether the first alignment type is selected or the second alignment type is selected, and
the peripheral circuit is configured to output the data in synchronization with both a rising edge and a falling edge of the second signal during the data output cycle when the first alignment type is selected.

2. The nonvolatile memory device of claim 1, wherein the peripheral circuit is configured to receive a command through the input/output pins in synchronization with one of the rising edge and the falling edge of the first signal during a command input cycle, and to receive a CLE signal through a CLE pin, and
the CLE signal is activated during the command input cycle, and deactivated both during the address input cycle and during the data output cycle.

3. The nonvolatile memory device of claim 1, wherein the peripheral circuit generates the second signal based on the first signal during the data output cycles when the first alignment type is selected.

4. The nonvolatile memory device of claim 1, wherein the peripheral circuit is configured to receive an ALE signal through an ALE pin, and
the ALE signal is activated during the address input cycle, and deactivated during the data output cycle.

5. The nonvolatile memory device of claim 1, wherein the second signal is deactivated so as not to toggle during the address input cycle.

6. The nonvolatile memory device of claim 1, wherein the peripheral circuit comprises:
an x-selector configured to select a plurality of memory cells among the nonvolatile memory cell array based on the address; and
a page buffer configured to store the data read from the plurality of memory cells,
a y-selector configured to receive the data from the page buffer circuit; and
an output buffer circuit configured to receive the data from the y-selector, and to output the data in synchronization with both the rising edge and the falling edge of the second signal.

7. The nonvolatile memory device of claim 1, wherein the first signal is deactivated so as not to toggle after the address is received completely.

8. A nonvolatile memory device comprising:
a nonvolatile memory cell array;
a peripheral circuit configured to receive a first address and a second address through input/output pins during an address input cycle, to receive first data through the input/output pins during a data input cycle, and to output second data through the input/output pins during a data output cycle;
an x-selector configured to select a first plurality of nonvolatile memory cells in the nonvolatile memory cell array based on the first address, and to select a second plurality of nonvolatile memory cells in the nonvolatile memory cell array based on the second address; and
a page buffer circuit configured to receive the first data from the peripheral circuit, to program the first data in the first plurality of nonvolatile memory cells, to read the second data from the second plurality of nonvolatile memory cells, and to provide the second data read from the second plurality of nonvolatile memory cells to the peripheral circuit,
wherein the peripheral circuit is configured to select one of a first alignment type and a second alignment type,
the peripheral circuit is configured to receive a first signal toggling between a high level and a low level during the address input cycle, and configured to output a second signal toggling between a high level and a low level during the data output cycle,
the peripheral circuit is configured to receive the first address and the second address in synchronization with one of a rising edge and a falling edge of the first signal regardless of whether the first alignment type is selected or the second alignment type is selected,
the peripheral circuit is configured to receive the first data in synchronization with one of the rising edge and the falling edge of the first signal during the data input cycle when the first alignment type is selected, and
the peripheral circuit is configured to output the second data in synchronization with both a rising edge and a falling edge of the second signal during the data output cycle when the second alignment type is selected.

9. The nonvolatile memory device of claim 8, wherein the peripheral circuit is configured to receive a command through the input/output pins in synchronization with one of the rising edge and the falling edge of the first signal during a command input cycle, and to receive a CLE signal through a CLE pin, and
the CLE signal is activated during the command input cycle, and deactivated both during the address input cycle and during the data output cycle.

10. The nonvolatile memory device of claim 8, wherein the peripheral circuit generates the second signal based on the first signal during the data output cycle when the first alignment type is selected.

11. The nonvolatile memory device of claim 8, wherein the peripheral circuit is configured to receive an ALE signal through an ALE pin, and
the ALE signal is activated during the address input cycle, and deactivated during the data output cycle.

12. The nonvolatile memory device of claim 8, wherein the second signal is deactivated so as not to toggle during the address input cycle.

13. The nonvolatile memory device of claim 8, wherein the first signal is deactivated so as not to toggle after the addresses are received completely.

14. A nonvolatile memory system comprising:
- a controller configured to provide set information for selecting one of a first alignment type and a second alignment type, to provide a first address and a second address during an address input cycle through input/output pins, to provide first data during a data input cycle through the input/output pins, and to provide a first signal toggling between a high level and a low level; and
- a nonvolatile memory device configured to receive the set information, the first address, the second address, the first data and the first signal, and to provide second data to the controller during a data output cycle through the input/output pins,
- wherein the nonvolatile memory device is configured to receive the first address and the second address in synchronization with one of a rising edge and a falling edge of the first signal regardless of whether the first alignment type is selected or the second alignment type is selected,
- the nonvolatile memory device is configured to receive the first data in synchronization with one of the rising edge and the falling edge of the first signal during the data input cycle when the first alignment type is selected,
- the nonvolatile memory device is configured to provide to the controller a second signal toggling between a high level and a low level, and to provide the second data in synchronization with both a rising edge and a falling edge of the second signal during the data output cycle when the second alignment type is selected.

15. The nonvolatile memory system of claim 14, wherein the nonvolatile memory device is configured to receive a command provided by the controller through the input/output pins in synchronization with the first signal during a command input cycle, and to receive a CLE signal provided by the controller through a CLE pin, and
- the CLE signal is activated during the command input cycle, and deactivated both during the address input cycle and the data output cycle.

16. The nonvolatile memory system of claim 14, wherein the nonvolatile memory device is configured to receive an ALE signal provided by the controller through an ALE pin, and
- the ALE signal is activated during the address input cycle, and deactivated during the data output cycle.

17. The nonvolatile memory system of claim 14, wherein the controller is configured to generate error check and correction data from the second data provided by the nonvolatile memory device.

18. The nonvolatile memory system of claim 14, wherein the nonvolatile memory device comprises:
- an x-selector configured to select a plurality of memory cells in the nonvolatile memory cell array based on the first address; and
- a page buffer configured to program the first data in the plurality of memory cells.

19. The nonvolatile memory system of claim 14, wherein the nonvolatile memory device comprises:
- an x-selector configured to select a plurality of memory cells in the nonvolatile memory cell array based on the second address; and
- a page buffer configured to store the second data read from the plurality of memory cells,
- a y-selector configured to receive the second data from the page buffer circuit; and
- an output buffer circuit configured to receive the second data from the y-selector, and to output the second data in synchronization with both the rising edge and the falling edge of the second signal.

20. The nonvolatile memory system of claim 14, wherein the first signal is deactivated so as not to toggle after the addresses are received completely.

* * * * *